United States Patent
Lu et al.

(10) Patent No.: US 9,627,439 B2
(45) Date of Patent: Apr. 18, 2017

(54) ZNO-BASED SYSTEM ON GLASS (SOG) FOR ADVANCED DISPLAYS

(71) Applicant: Rutgers, The State University of New Jersey, New Brunswick, NJ (US)

(72) Inventors: Yicheng Lu, East Brunswick, NJ (US); Chieh-Jen Ku, Edison, NJ (US)

(73) Assignee: RUTGERS, THE STATE UNIVERSITY OF NEW JERSEY, New Brunswick, NJ (US)

(*) Notice: Subject to any disclaimer, the term of this patent is extended or adjusted under 35 U.S.C. 154(b) by 0 days.

(21) Appl. No.: 14/399,367

(22) PCT Filed: May 8, 2013

(86) PCT No.: PCT/US2013/040222
§ 371 (c)(1),
(2) Date: Nov. 6, 2014

(87) PCT Pub. No.: WO2014/021972
PCT Pub. Date: Feb. 6, 2014

(65) Prior Publication Data
US 2015/0155334 A1    Jun. 4, 2015

Related U.S. Application Data

(63) Continuation-in-part of application No. 13/781,915, filed on Mar. 1, 2013, now Pat. No. 8,884,285, which
(Continued)

(51) Int. Cl.
*H01L 27/24* (2006.01)
*H01L 29/786* (2006.01)
*H01L 45/00* (2006.01)

(52) U.S. Cl.
CPC ...... *H01L 27/2436* (2013.01); *H01L 29/7869* (2013.01); *H01L 45/08* (2013.01); *H01L 45/146* (2013.01)

(58) Field of Classification Search
CPC  H01L 27/2436; H01L 45/146; H01L 29/7869
See application file for complete search history.

(56) References Cited

U.S. PATENT DOCUMENTS 8,884,285 B2 *  11/2014  Lu ................ H01L 27/2481
257/2
2001/0010374 A1  8/2001  Takayama
(Continued)

FOREIGN PATENT DOCUMENTS

WO    2010055988 A1    5/2010
WO    2011080866 A1    7/2011

OTHER PUBLICATIONS

International Search Report for PCT/US2013/040222, dated Mar. 5, 2014.
(Continued)

*Primary Examiner* — Mark Prenty
(74) *Attorney, Agent, or Firm* — Fox Rothschild LLP

(57) ABSTRACT

A ZnO based display pixel structure that includes system-on-glass (SOG) substrates with embedded non-volatile resistive random access memory iNV-RRAM) is provided. Such pixels feature high frame rates and low power consumption. The entire SOG is based on ZnO devices. Different devices including TFT, TCO, RRAM, inverters, and shift registers are obtained through doping of different elements into selected ZnO active regions. This reduces the cost to package control circuitry onto a backplane of a display system, resulting in a low cost, light weight and uUra-thin display.

12 Claims, 7 Drawing Sheets

Related U.S. Application Data is a continuation of application No. 13/549,413, filed on Jul. 13, 2012, now abandoned.

(60) Provisional application No. 61/644,068, filed on May 8, 2012, provisional application No. 61/507,293, filed on Jul. 13, 2011.

(56) References Cited

U.S. PATENT DOCUMENTS

| | | |
|---|---|---|
| 2008/0164568 A1 | 7/2008 | Lee et al. |
| 2009/0289251 A1 | 11/2009 | Kiyotoshi |
| 2010/0224873 A1 | 9/2010 | Sakata et al. |
| 2011/0068334 A1 | 3/2011 | Yamazaki et al. |
| 2011/0114941 A1 | 5/2011 | Kato et al. |
| 2011/0128779 A1 | 6/2011 | Redaelli et al. |
| 2011/0140069 A1 | 6/2011 | Inoue |
| 2011/0140762 A1 | 6/2011 | Jiang et al. |
| 2011/0180802 A1 | 7/2011 | Morosawa et al. |
| 2011/0186799 A1 | 8/2011 | Kai et al. |
| 2012/0170355 A1 | 7/2012 | Ohmaru et al. |

OTHER PUBLICATIONS

Written Opinion for PCT/US2013/040222, dated Mar. 5, 2014.
International Preliminary Report on Patentability for PCT/US2013/040222, dated Nov. 11, 2014.
Ku, et al., "Effects of Mg on the electrical characteristics and thermal stability of $Mg_xZn_{1-x}O$ thin film transistors," Applied Physics Letters, 2011, vol. 98, pp. 123511-1 to 123511-3.
Liu et al., "ZnO-based one diode resistor device structure for crossbar memory applications," Applied Physics Letters, 2012, vol. 100, p. 153503.
Ohtomo et al., "Proto-Irresponsive Thin-Film Transistor with $Mg_xZn_{1-x}O$ Channel," Japanese Journal of Applied Physics [online], 2006, vol. 45, pp. L694-L696.

\* cited by examiner

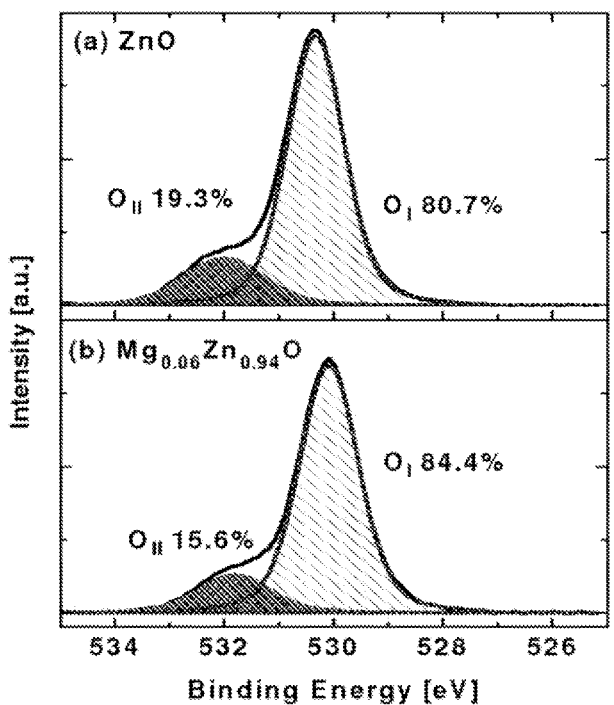
FIG. 5A
FIG. 5B
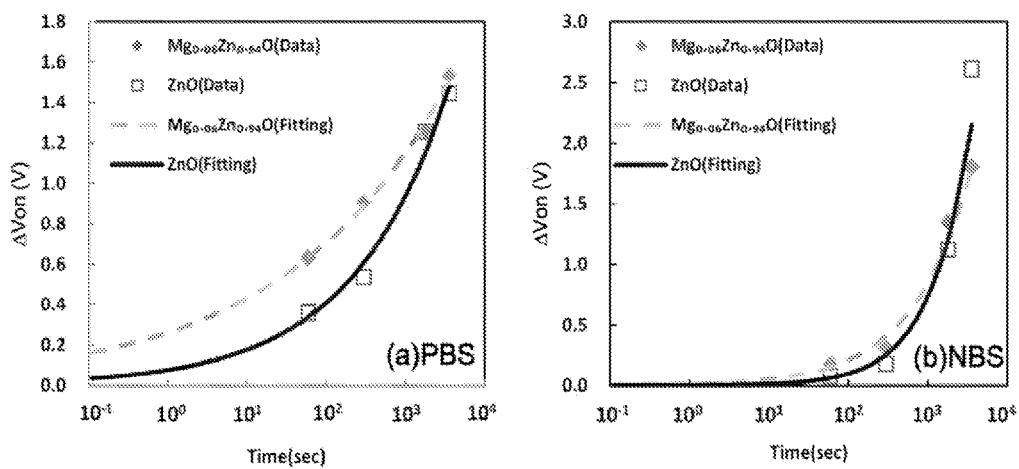
FIG. 6A
FIG. 6B

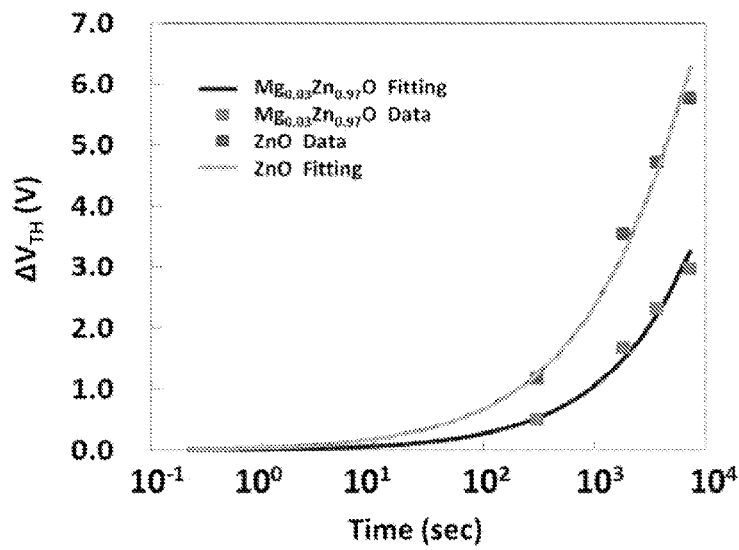
FIG. 7
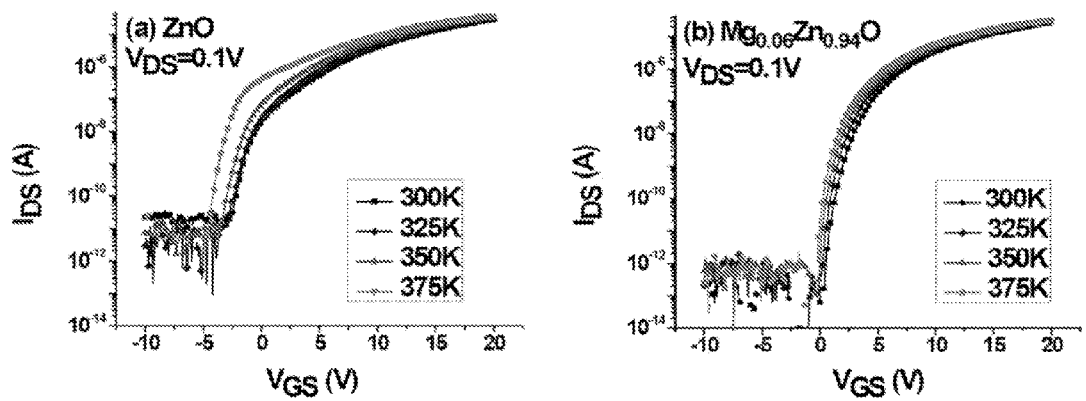
FIG. 8A
FIG. 8B

ZNO-BASED SYSTEM ON GLASS (SOG) FOR ADVANCED DISPLAYS

REFERENCE TO RELATED APPLICATIONS

This application is a non-provisional application claiming, priority to U.S. Provisional Patent Application Ser. No. 61/644,068 filed May 8, 2012, which is hereby incorporated by reference as if fully disclosed herein. This application is a continuation-in-part of U.S. patent application Ser. No. 13/781,915 filed Mar. 1, 2013 which is a continuation of U.S. patent application Ser. No. 13/549,413 filed Jul. 13, 2012, now abandoned, which claimed priority to U.S. Provisional Patent Application Ser. No. 61/507,293 filed Jul. 13, 2011, the disclosures of each of which is hereby incorporated by reference as if fully disclosed herein.

STATEMENT REGARDING FEDERALLY SPONSORED RESEARCH

This disclosure was made with government support under Grant No. NSF ECCS-1002178 awarded by the National Science Foundation and Grant No. FA 9550-08-1-0452 awarded by Air Force Office of Scientific Research. Accordingly, the Government has certain rights in this disclosure.

FIELD OF INVENTION

The present disclosure relates to integration of ZnO-based technologies including thin film transistor (TFT) and non-volatile memory (based on the resistive switching device) to form the pixel structures for advanced displays that require high frame rates, low power, and light weight, specifically for three-dimensional (3D) displays.

BACKGROUND

Thin film transistors (TFTs) are a class of field effect transistors (FETs), in which the current through the channel is modulated on the same basic principle as in the Metal Oxide Semiconductor Field Effect Transistor (MOSFET). Unlike the MOSFET where the substrate material is the bulk semiconductor, such as the single crystalline silicon, in the TFT, the thin film of semiconductor materials is deposited on substrates such as glasses or polymers to form the channel layers of TFTs. TFTs are emerging for large area electronics, particularly, the display systems. Hydrogenated amorphous silicon (a-Si:H) and polycrystalline silicon (poly-Si) TFTs are current industry standard for the switching and drive circuitry of monolithic active matrix liquid crystal display (AMLCD) and active matrix organic light emitting diode (AMOLED) technology.

Referring now to FIG. 1, a conventional display pixel 100 used in AMOLEDs generally has two amorphous silicon thin film transistors ("TFTs") 102, 104, a storage capacitor 106, and an organic light emitting diode ("OLED") 108. The two TFTs include a switching TFT 104 and a driver TFT 102. The TFTs 102, 104, interconnect lines, and storage capacitor 106 are the circuitry that drive the OLED 108, and are referred to as backplane of the display. The OLED 108 is the light emitting element, and is the frontplane of the display. During operation, the switching TFT 104 is turned on and the data signal can be propagated to a storage node 110. This action charges up the storage capacitor 106 and sets up the gate voltage of the driver ITT 102. The driver TFT 102 converts the data signal into the electrical current. The resulting brightness of the OLED 108 is determined by the output current of the driver TFT 102. The conventional pixel 100 uses a storage capacitor 106 to hold the electrical charges in the pixel. The charges stored in the capacitor 106 constantly leak out and therefore, refresh cycles are required to maintain a static image. Such refresh cycles introduce the power consumption of the display system. Because of the low mobility of amorphous silicon, conventional TFTs cannot drive large area display systems with frame rates higher than 120 Hz. The requirement of mobility is even higher for displays with higher resolution.

Recently, three-dimensional ("3D") displays with 240 Hz frame rates have been produced. However, higher frame rates of 480 Hz are required to improve picture quality because a 3D display must project two or more pictures alternately for left and right eyes. Accordingly, there is as need in the art for a pixel structure that can support the frame requirement of new 3D displays, while not increasing power consumption in comparison to existing pixel structures.

SUMMARY

In one aspect, the present disclosure is directed to a novel system on glass (SOG) for 3D displays of mobile devices. As smart phones and tablets become more popular, ultra-thin display with low power consumption will become desirous for consumer electronics. In one embodiment of the present disclosure, ZnO based novel display SOG substrates with embedded non-volatile resistive random access memory (NV-RRAM) pixels are provided. Such pixels feature high frame rates and low power consumption.

In another aspect, the entire SOG is based on ZnO devices. Different devices including TFT, TCO, RRAM, inverters and shift registers are obtained through doping of different elements into selected ZnO active regions. This reduces the cost to package control circuitry onto as backplane of a display system, resulting in a low cost, light weight and ultra-thin display. With the low power embedded NV-RRAM pixel structure, such product features low cost, light weight, ultra-thin, low power for mobile devices and can perform 3D display.

BRIEF DESCRIPTION OF THE DRAWINGS

Embodiments will be described with reference to the following drawing figures, in which like numerals represent like items throughout the figures, and in which:

FIG. 5A shows the $O_{Is}$ peaks in the XPS spectra of a pure ZnO channel layer.

FIG. 5B shows the $O_{Is}$ peaks in the XPS spectra of a $Mg_xZn_{1-x}O$ channel layer.

FIG. 6A shows a fitted graph of threshold voltage for a ZnO TFT and an $Mg_{0.06}ZnO_{0.94}O$ TFT under positive bias stress of $V_g$=20V.

FIG. 6B shows a fitted graph of threshold voltage for a ZnO TFT and an $Mg_{0.06}Zn_{0.94}O$ TFT under negative bias stress of $V_g=-20V$.

FIG. 7 shows to fitted graph of threshold voltage for a ZnO TFT and a $Mg_{0.03}Zn_{0.97}O$ TFT under negative bias stress.

FIG. 8A shows transfer characteristics of ZnO TFTs at different temperatures.

FIG. 8B shows transfer characteristics of $Mg_xZn_{1-x}O$ TFTs at different temperatures

DETAILED DESCRIPTION

Figure 1:
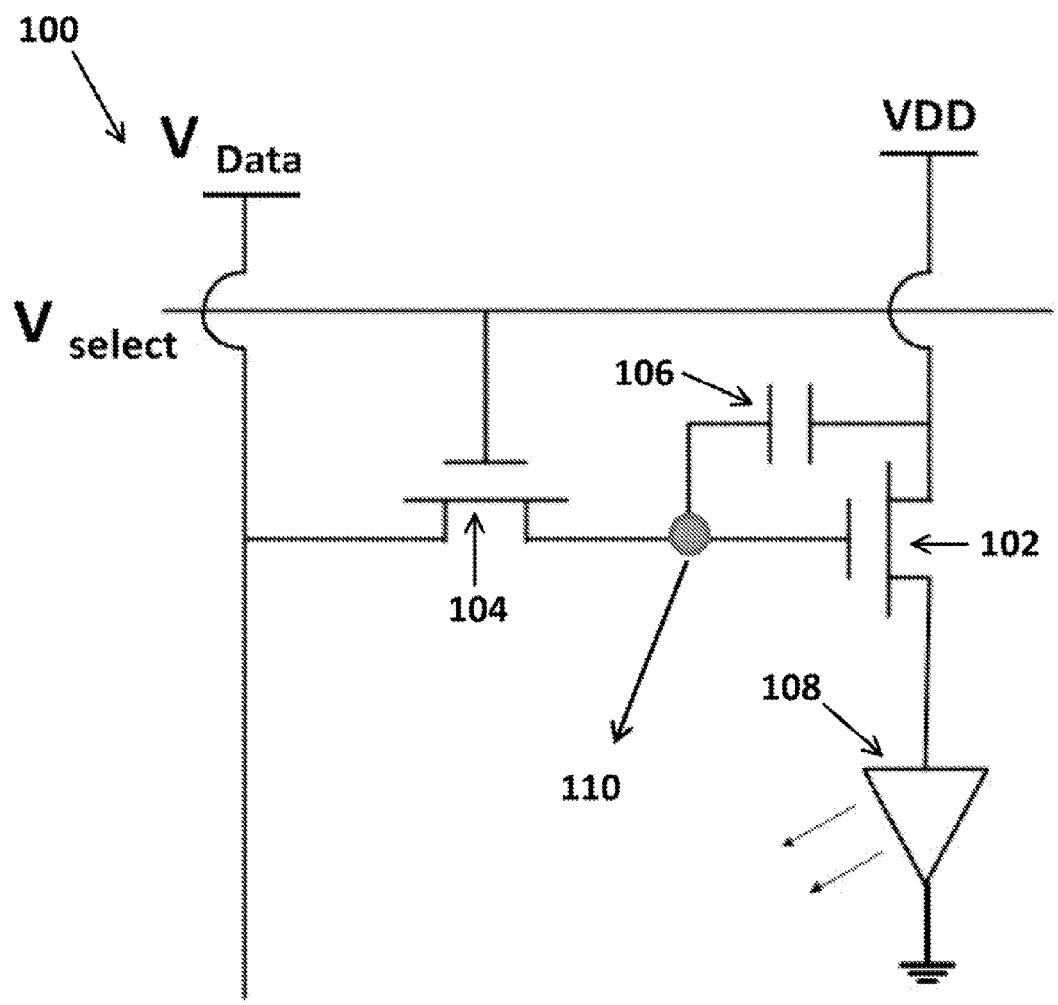
FIG. 1 shows the conventional pixel of an AMOLED system.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

As modern three dimensional (3D), high definition (HD) and intelligent displays move toward lower power consumption, higher resolution, larger area, and faster refresh rates, conventional Si based TFTs will be utilized less frequently. There has been increasing interest in the use of oxide based TFTs as electronic back-plane switching devices for the next generation large area flat-panel display applications. Among all oxide materials, Zinc oxide (ZnO)-based materials have been receiving increasing attention as an alternative and advanced TFT technology due to its transparency in the visible region, and higher mobility over amorphous silicon, leading to higher drive currents and faster device operating speed.

The present disclosure describes the in-situ doping of the small amount of Mg into ZnO to form $Mg_xZn_{1-x}O$ (0<x≤6%) TFTs. The $Mg_xZn_{1-x}O$ (0<x≤6%), i.e. MZO TFT possess the advantages over the pure ZnO and In-contained oxides-based, such as InGaZnO (IGZO) and InZnO (IZO) TFTs, including superior reliability due to the significant reduction of the cost and improvement of the environment protection without using Indium. It has been found that the reliability issues in ZnO based TFTs are associated with oxygen vacancy related defects in the TFT channel layers. $Mg_xZn_{1-x}O$ TFT technology using a small composition of Mg (0<x≤6%) significantly suppresses the oxygen vacancies; therefore, improves bias stress stability and temperature stability. The Mg composition in the $Mg_xZn_{1-x}O$ (MZO) layer is kept less than or equal to 6% to as the alloying induced scattering and disorder in the MZO channel.

For the application of TFTs as the driver/switch devices in the display technology, stability against bias stress is the key prerequisite. The brightness of each pixel is dependent on the drain current of the driving TFT. TFTs must remain stable over time, since any shift in threshold voltage would change the brightness of individual pixel and introduce non-uniformity of displays. Based on understanding developed for a:Si—H TFTs, bias stressing may lead to instabilities such as charge trapping and defect formation in the active channel, in the gate dielectric or at the channel/dielectric interface. It is also expected that an increased temperature could lead to additional instabilities.

It has been found that in ZnO based TFTs, the device characteristics, including field effect mobility, on-off ratio, subthreshold swing, and bias stress stability, are strongly impacted by the presence of native defects in the channel layer. First principles calculation shows that the oxygen vacancy in ZnO has the lowest formation energy among the donor-like defects with deep electronic states. Generally, an oxygen vacancy in the n-type ZnO is in the neutral state ($V_o$). However, under the negative gate voltage, the band bending can create the electron depletion region in the TFT channel. In this region, $V_o$ can be excited to doubly ionized state ($V_o^{2+}$) and releases electrons into conduction band. Thus, the generation of $V_o^{2+}$ thermally excited $V_o$ in the depletion region under as negative gate voltage increases the conductivity, resulting in the thermal instability of TFTs. Instabilities include as negative shift of the threshold voltage and an increase of the drain current. To suppress oxygen vacancies in ZnO films, annealing in oxygen ambient at high temperature has been widely used. However, the high temperature also leads to excessive interfacial diffusion between the channel and the gate dielectric, resulting in a degradation of the TFT. Mg can be a good candidate to serve as the oxygen vacancy suppressor in ZnO TFTs. First, the $Mg^{2+}$ substitution in the $Zn^{2+}$ site does not cause significant lattice distortion due to their similar ionic radii ($Mg^{2+}$:0.57 Å vs $Zn^{2+}$:0.60 Å). Second, owing to the strong ionic characteristic of MgO, the bonding energy of MgO (393.7 kJ/mole) is higher than ZnO (284.1 kJ/mol) at 298 K. First principles calculations also indicate that MgO has a higher formation energy per oxygen vacancy (10.08 eV) than ZnO (7.01 eV). It has been reported that alloying of Mg into ZnO can reduce deep level luminescence associated with oxygen vacancies in both polycrystalline and epitaxial $Mg_xZn_{1-x}O$ films.

The present disclosure is also cost-effective by eliminating the Indium in the TFT channel layers. The price of Indium has grown tremendously in past years. There are only a few countries in the world that export Indium. It is important to develop a next generation TFT technology where raw materials are more abundant and less expensive. ZnO also has availability of wet chemical processing, making the device fabrication process easier and cheaper. In addition, as environmental contamination regulations become restrictive in United States, the $Mg_xZn_{1-x}O$ (0<x≤6%) TFTs may become a green technology in the display industry because both Zinc (Zn) and Magnesium (Mg) are environmental friendly and bio-compatible whereas Indium (In) is not.

Because ZnO is, in general, an n-type semiconductor, the n-type metal-oxide-semiconductor ("NMOS") based inverter configurations may to be used for ZnO TFTs. The inverter is a basic circuit building block of a digital system. Active load inverters are dominant over the traditional resistive load inverters due to their compatibilities with simple fabrication process and less occupied area. An enhancement mode load/enhancement mode driver (E/E inverter) can be easily fabricated on single substrate because the channel layers are the same for load and driver. The gain of an E/E inverter, however, is limited by the W/L (channel width/channel length) ratios between load and driver, meaning that the W/L of the enhancement load has to be much larger than that of the driver to obtain high gain. Conversely, depletion mode load/enhancement mode driver inverter (D/E inverter) can achieve a larger gain with lower W/L ratios between the load and the driver. Different doping elements may be used to form the channel layers with different carrier concentrations: Gallium (Ga) doping and Magnesium (Mg) doping may be used for the depletion-mode load and enhancement-mode driver, respectively. Our previous studies have shown that Mg doping into ZnO can suppress background carrier concentration, therefore, increases threshold voltage to obtain enhancement mode TFT. Conversely, Group III elements such as Al and Ga are shallow donors for ZnO to form the transparent conductive oxide (TCO) electrodes, and thus are suitable to form the depletion-mode TFT. Integration of these two TFTs can produce a high gain D/E inverter at low cost without a complicated fabrication process. The present disclosure utilizes selective doping method described above to implement two TFTs to build a high gain D/E inverter. Integration of such inverters can build a different circuitry for the application of the system on glass.

The ability to integrate the driver circuit on active TFT display system can lead to light weight displays with lower cost due to the reduction of external driver chips and driver interconnects. The motivation of higher integration is to reduce the power consumption of the display. Power consumption is critically dependent on the operation voltage of the drivers in the display. The most effective way to reduce power consumption is to lower the operation voltage of the driving circuit. However, the operating speed of the display may be reduced as the driving voltage decreases. To compensate this issue, the mobility of driving devices (TFTs) has to be increased. High mobility of the $Mg_xZn_{1-x}O$ (0<x≤6%) TFT (~48 $cm^2$/V-s) can meet such requirements for low power consumption and high operating speed.

Memory on pixel is a novel technology aims to reduce power consumption by storing pixel information into non-volatile memory instead of typical storage capacitor. The conventional pixel uses to storage capacitor to hold the electrical charges in the pixel (see, e.g., FIG. 1). The charges stored in the capacitor constantly leak out and therefore, refresh cycles are required to maintain to static image. Such refresh cycles introduce the power consumption of the display system. To integrate non-volatile memory into the pixel arrays, charge trapping type of Flash memory, or oxide/nitride/oxide (O/N/O) layer is built on amorphous silicon/poly silicon TFTs. Fundamental mechanism of such Flash memory is to use electron tunneling into a charge trapping layer as tile stored information. However, such device usually requires high operating voltage (>35V) for electrons to tunnel into charge trapping layer which is contrary in the low power consumption desired in display technologies. In addition, such Flash technology also suffers from reliability issue including low yield, short retention time and slow read/write speed because of degradation of O/N/O layer after electron tunneling. In term of fabrication issue, such Flash technology requires high cost since multiple layers structures need to be deposited on top the amorphous Si/poly Si TFTs.

The resistive switching device (R) is a class of metal-insulator-metal (MIM) structure where the bi-stable resistance states of the insulating layer can be achieved by applying different voltages at two electrodes. High resistance state (HRS) and low resistance state (LRS) can be utilized to store the 0/1 bits in memory architecture. As one example, we have demonstrated the Fe-doped ZnO resistive switching device built on glass with a $R_{ON}/R_{OFF}$ ratio>$10^5$ for bipolar and >$10^6$ for unipolar switching device, respectively. The retention time is over $10^7$ sec. Such devices have demonstrated the ability to be operated in very low voltage (~1.5V), particularly for displays with low power application.

Figures 2A, 2B:
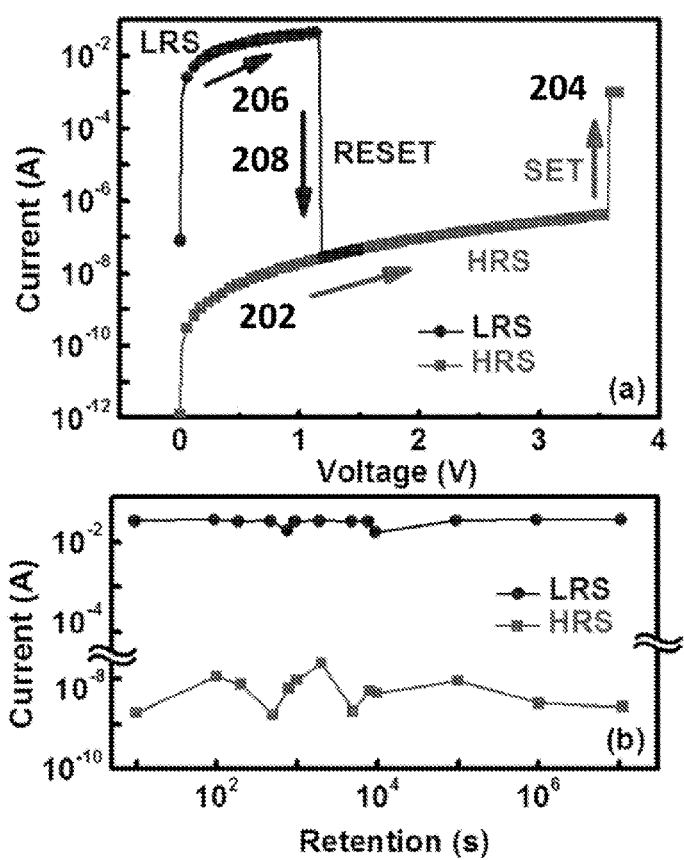
FIG. 2A shows the I-V characteristics of a FeZnO/MgO switching resistor.
FIG. 2B shows the retention time of a FeZnO/MgO switching resistor.

FIG. 2A shows example I-V characteristics of an embodiment Pt/MgO/FeZnO/Au unipolar resistive switching structure. The resistance state of the device begins in HRS 202. When the applied voltage reaches the SET region 204, the device turns to LRS and remains in LRS 206. When the voltage reaches the RESET voltage 208, the resistive state switches back to HRS 202. When the measured voltage reaches 1V, the $R_{HRS}/R_{LRS}$ ratio is 2.4×$10^6$. A retention time of $10^7$ seconds may be obtained as shown in FIG. 2B. Higher fluctuations in HRS compared to LRS are due to the different conduction mechanisms between HRS and LRS. After eight months (~2×$10^7$ s) and more than 200 testing cycles, the $R_{HRS}/R_{LRS}$ ratio remained larger than $10^5$. It is noteworthy to point out that the resistive switching devices reported so far have shown over 10 years retention time through the accelerated tests, which is suitable for the display applications.

In addition to Fe-doped ZnO, the other transitional metal (TM) doped ZnO, the other oxide materials including but not limited to $HfO_2$, $TiO_2$, $Ta_2O_5$, etc. Organic and inorganic polymer materials can also be used to make the resistive switching devices on the glass substrates.

With addition of ZnO TFTs as the addressing devices to form a 1T1R array, ZnO resistive random access memory (RRAM) can be realized. ZnO RRAMs in an ultra-high-density configuration perform both the non-volatile characteristics of Flash memory and the high speed of SRAM. Furthermore, both active device (TFT) and memory storage (RRAM) can all be built on the same material system in ZnO. This incorporates ZnO based TFTs and RRAMs into a single pixel and build basic building blocks of control circuitry directly on the same substrate to realize system on glass (SOG) for the ultra-thin, low power 3D displays. "System on glass" refers to the fabrication of electronics technology by depositing the TFTs and other electronic components directly on an electronic visual display substrate, which may comprise glass, flexible polymer substrates, organic and inorganic solid state substrates, and the like.

Figure 3:
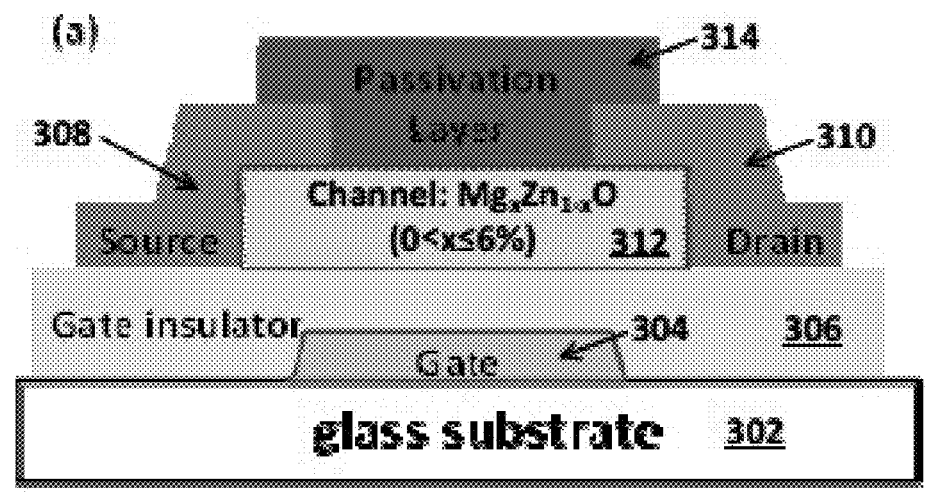
FIG. 3 shows an inverted staggered (bottom gate) $Mg_xZnO_{1-x}O$ (0<x≤6%) thin film transistor (TFT).

$Mg^{2+}$ ions can be incorporated to prevent oxygen out-diffusion and hinder the formation of oxygen vacancies in the TFT channel. The Mg composition is limited to no more than 10% to minimize deterioration of the field effect mobility. FIG. 3 shows an embodiment of a ZnO TFT. The structure of FIG. 3 includes a substrate 302, a gate electrode 304, a gate insulator or dielectric 306, a source 308, a drain 310, a ZnO channel layer 312, and a passivation layer 314. Bottom gate $Mg_xZn_{1-x}O$ TFTs were fabricated on heavily-doped n-type Si wafers with a 100 nm thermally grown $SiO_2$. The 50 nm-$Mg_xZn_{1-x}O$ (x=0, 0.06 and 0.10) channels are grown by metal-organic chemical vapor deposition (MOCVD) at 450° C. DEZn (diethyl zinc) and $MCp_2Mg$ (bis (methylcyclo-pentadienyl) magnesium) can be the precursors for Zn and Mg, respectively. The source 308 and drain 310 metallizations can be formed with 100 nm Ti/50 nm Au by a lift-off process. The active layer is fixed at a width/length (W/L)=150 μm/5 μm. To prevent ambient absorption/desorption during the electrical testing, a SU-8 photoresist is coated on top of the TFT channel, selling as a passivation layer 314.

Figures 4A, 4B:
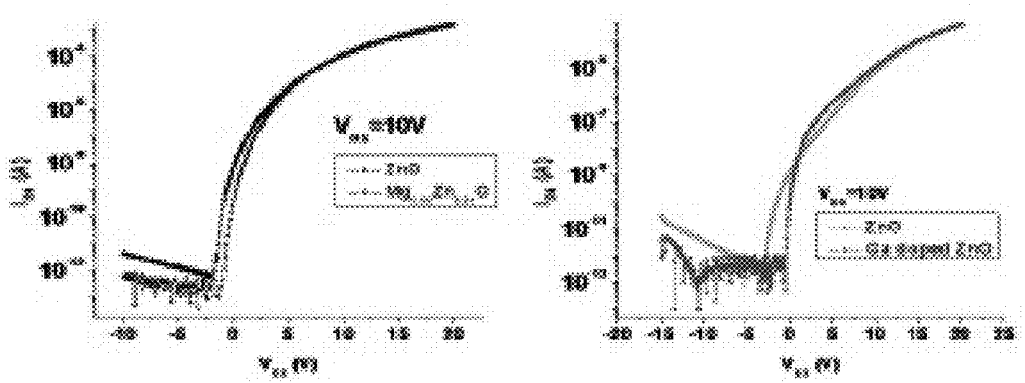
FIG. 4A is a graph showing the $I_{ds}$-$V_{gs}$ characteristics of a $Mg_xZnO_{1-x}O$ (0<x≤6%) TFT and an undoped ZnO TFT.
FIG. 4B is a graph showing the $I_{ds}$-$V_{gs}$ characteristics of a Ga:ZnO TFT and an undoped ZnO TFT.

The material quality of the channel layer is important for the TFT performances. It has been found that the oxygen vacancy in ZnO channel layer would significantly affect the TFT's electrical characteristics, including field effect mobility, subthreshold slope, bias stress stability and thermal stability. We have demonstrated that alloying of Mg into ZnO channel can suppress the oxygen vacancy, resulting in lower subthreshold slope (0.25V/dec), higher field effect mobility (40 $cm^2$/V-s) and better thermal stability ($\Delta V_{th}$=0.5V at T=375K). Our studies show that doping of different elements into channel layers of ZnO based TFTs can further improve electrical characteristics such as field effect mobility, bias stress stability, and thermal stability. We have systematically studied the in-situ doping/alloying process during MOCVD growth, particularly, the doping effects of Ga and Mg into ZnO channel layers. Recent results show that both Ga and Mg can suppress intrinsic defect such as oxygen vacancy in the ZnO channel and improve performance of ZnO TFTs, as shown in FIGS. 4A (Mg doping) and 4B (Ga doping). Through doping, the field mobility is enhanced from 30 $cm^2$/V-s to 48 $cm^2$/V-s, which is among the best reported values in the literatures. In addition, significant improvements of bias stress stability and thermal stability are observed. Unlike ion implantation used for silicon TFTs, where post annealing treatment is required to repair defects introduced during the implantation, in-situ doping in ZnO eliminates the post annealing processing and provides a loss temperature process, particularly useful for displays and flexible electronics. Therefore, it is essential to explore in-situ doping technology of ZnO based TFTs to reach faster switch speed, long term stability and multifunctionalities.

FIG. 5A shows $O_{Is}$ peaks in XPS spectra of ZnO and FIG. 5B shows $O_{Is}$ peaks in XPS spectra of $Mg_{0.06}Zn_{0.94}O$ thin films. Gaussian fitting is used in the deconvolution of these $O_{Is}$ peaks. The original $O_{Is}$ peaks were deconvoluted by Gaussain fitting into two subpeaks including $O_I$ (oxygen bonded with Zn) kind $O_{II}$ (oxygen vacancy related). The peak area of $O_{II}/(O_I+O_{II})$ is reduced after incorporation a 6% Mg into the ZnO. The peak at the lower binding energy ~530 eV ($O_I$) is attributed to present in a stoichiometric wurtzite ZnO structure, whereas the peak at the higher binding energy ~532 eV ($O_{II}$) has been attributed to $O_2$-ions in "oxygen deficient" ZnO. The ratio of peak area ($O_{II}/O_{Tot}$), indicating the relative quantity of this oxygen-related defect, is reduced from 19.3% (for ZnO) to 15.6% (for $Mg_{0.06}Zn_{0.94}O$) after 6% Mg is alloying into the ZnO thin film. Also, the $O_I/O_{II}$ peak positions shifted to lower binding energies from 530.32/532.08 eV to 530.08/531.8 eV due to a decrease in the number of oxygen vacancies. In conclusion, with 6% Mg incorporation into a ZnO channel, the field effect mobility and sub-threshold swing values are improved. A smaller (negative) shift of threshold voltage and higher activation energy are observed. The improved electrical characteristics and thermal stability of $Mg_{0.06}Zn_{0.94}O$ TFT are mainly attributed to the suppression of oxygen vacancies by introducing stronger Mg—O bonding in the channel layer.

For emissive and current driven display application, the brightness of each pixel is highly dependent on the drain current of driving TFT. In this case, TFT stability is critical. TFTs must remain stable over long time, because any shift in $V_t$ would change the brightness of individual pixel and cause display non-uniformity. In TFTs, the main mechanism of positive bias stress (PBS) instability may be due to charge trapping at channel/insulator interface or at gate insulator while negative bias stress (NBS) instability is attributed to deep level defects in the channel layer. Moreover, the oxygen desorption/adsorption is also responsible for the instability of ZnO TFTs owing to introduction of the additional electron depletion region at the surface. Studies on bias stress stability of $Mg_xZn_{1-x}O$ (0<x≤6%) TFTs is that the mechanism of NBS is mainly due to generation of oxygen vacancies related deep level defects under a long period of negative bias. Therefore, to improve the reliability of ZnO based TFTs, high quality channel/gate insulator interface and superior channel material with low defect concentration may be achieved. Shifts of threshold voltages under positive bias stress and negative bias stress can be fitted with the stretched-exponential model as shown in FIG. 6A (PBS) and FIG. 6B (NBS). The characteristic trapping time constant of $Mg_xZn_{1-x}O$ (0<x≤6%) TFTs is significantly larger than ZnO TFTs, implying that the defect creation in $Mg_xZn_{1-x}O$ TFTs is suppressed; therefore, charge trapping due to defects creation is reduced.

In addition, the stability against negative bias stressing is more critical for ZnO based TFTs. It is because that switching TFTs consisting of n type transistors in displays are usually operated in the "OFF" state, lasting more than 500 times longer than the "ON" state. We have investigated the negative bias stress stability of $Mg_xZn_{1-x}O$ TFTs. For both low electrical field (2 MV/cm) and high electrical field (5 MV/cm), $Mg_xZn_{1-x}O$ (0<x≤6%) TFTs exhibits superior negative bias stress stability over ZnO based TFTs. The enhanced stability against both positive bias stress and negative bias stress can improve the power consumption of display and reduce the cost to implement other circuits to compensate the shifts of threshold voltage after bias stressing.

The instability induced by NBS in ZnO based TFTs could be the result of ionization of existing oxygen vacancies in the channel and their subsequent migration toward the dielectric/channel interface. For a fresh device, the Fermi level is near conduction band minimum (CBM) and the oxygen vacancy is at the neutral charge state. During NBS, the depletion region is created in the ZnO channel layer, giving rise to the larger upward bending of energy band. Inside the depletion region, the quasi Fermi level is lowered to near midgap level and becomes closer to valence band maximum (VBM), reducing formation energies of ionized oxygen vacancies. The ionization from $V_o$ to $V_o^{2+}$ introduces outward relaxation of neighboring Zn atoms. Due to a high electric field and a long duration under NBS, presence of $V_o^{2+}$ cause position changes of surrounding atoms, including ones that are distant from $V_o^{2+}$. In this case, the rearrangement of atomic structure induced $V_o^{2+}$ increases the energy barrier for returning its initial position, leading to the stabilization of $V_o^{2+}$. As duration of NBS prolongs, the migration of oxygen vacancies takes place. The migration of oxygen vacancies involves in that a nearest-neighbor oxygen atom in the oxygen lattice jumps into the original vacant site leaving a vacancy behind. The calculated migration energy barrier for $V_o^{2+}$ is 1.7 eV and for $V_o$ is 2.4 eV, making $V_o^{2+}$ more mobile under an electric field. Under NBS, mobile $V_o^{2+}$ can migrate to dielectric/channel interface and become trapped positive charge, which causes NBS instability later.

In a first embodiment, the amount of Mg doping may be kept low in $Mg_xZn_{1-x}O$ (x=0.03) to avoid the degradation of TFT electrical characteristics from the alloying induced scattering and disorder. The negative bias stressing (NBS) stability of ZnO thin film transistors (TFTs) is significantly improved by replacing the pure ZnO with its ternary alloy $Mg_{0.03}Zn_{0.97}O$ as the conducting channel. The $Mg_{0.03}Zn_{0.97}O$ TFT shows smaller subthreshold slope and higher field effect mobility over its ZnO counterpart, indicating a better quality of the channel layer after introducing a small percentage of Mg into ZnO. $Mg_{0.03}Zn_{0.97}O$ TFT also shows much smaller negative shifts of its transfer characteristic curves under NBS. The shifts of threshold voltages ($\Delta V_{th}$) with respect to stressing tine ($t_{NBS}$) are fitted into the stretched-exponential model, as illustrated in FIG. 7. Before NBS, the amount of oxygen vacancies in the $Mg_{0.03}Zn_{0.97}O$ TFT is less than that in the ZnO TFT due to higher Mg—O bonding energy. During NBS, substantial function of oxygen vacancies existing in the channel layer are ionized and then migrate toward the channel/gate dielectric interface. Thus, a reduced amount of ionized oxygen vacancies in the $Mg_{0.03}Zn_{0.97}O$ TFT provides fewer free electrons to the $Mg_{0.03}Zn_{0.97}O$ channel and the TFT turn-off will require less negative gate bias. In consequence, a smaller negative shift of threshold voltage is observed and the improvement of NBS stability is obtained for the $Mg_{0.03}Zn_{0.97}O$ TFT. The superior stability against the NBS is mainly attributed to the reduction of donor-like defects associated with ionized oxygen vacancies in the TFT channel.

FIGS. 8A and 8B illustrate the evolution of the transfer characteristics of a second embodiment of the Mg doped ZnO TFTs exhibiting a Mg doping level of 6%. Specifically, FIG. 8A shows the transfer characteristics of pure ZnO at different temperatures, ranging from 300K to 375K. FIG. 8B shows the transfer characteristics of $Mg_{0.06}Zn_{0.94}O$ TFTs at different temperatures, ranging from 300K to 375K. Both TFTs exhibit a negatively shifted threshold voltage $V_{th}$ with increasing temperature: $\Delta V_{th}$ of ZnO TFT and $Mg_{0.06}Zn_{0.94}O$ TFT are 1.5V and 0.5 V, respectively. The sub-threshold drain current of ZnO TFT increases from $2.2 \times 10^{-10}$ A to $8.6 \times 10^{-8}$ A with a $V_{GS}$ of −2V. In contrast to the ZnO TFT, the sub-threshold drain current of $Mg_{0.06}Zn_{0.94}O$ TFT only increases from $2.3 \times 10^{-10}$ A to $8.0 \times 10^{-9}$ A with a $V_{GS}$ of 1.5V. Under a negative gate voltage, neutral oxygen vacancies ($V_o$) in the depletion region of ZnO channel can be thermally excited to ionized state ($V_o^{2+}$). Ionized oxygen vacancies would release electrons into the conduction band. The higher channel conductivity and lower $V_{th}$ are induced by the formation of ionized oxygen vacancies. The improved thermal stability and electrical characteristics of $Mg_{0.06}Zn_{0.94}O$ TFT can be mainly attributed to a reduced density of oxygen vacancies and the associated electron traps by incorporation of Mg ions into ZnO.

The present disclosure provides a low power pixel for use with display technology, particularly 3D display technology. The display system has advantages of wider viewing angle, light weight, faster respond time, better contrast ratio, simple structure, and low power consumption. Ultra low power consumption is achieved by utilizing a non-volatile RRAM to store the information of pixel brightness. Compared to conventional TFT based non-volatile Flash technology where the program voltage is high (~35V) and read/write speed is slow, the ZnO-based RRAMs of certain embodiments of the present disclosure can be operated at much lower voltage (~1.5 V) and much faster speed (~1 nano second). Use of these RRAMs in conjunction with high mobility ZnO TFTs, such pixel structure can be operated at low voltage and high frame rates. Thus, high frame rates necessary for 3D displays can be achieved based on our novel pixel structure while consuming low power.

In a third embodiment, the in-situ doping of Mg into ZnO to form $Mg_xZn_{1-x}O$ (0<x≤6%) TFTs as driver TFTs in a pixel structure, which possess the significant advantages over the pure ZnO and InGaZnO TFTs, including superior reliability due to enhanced bias stress and thermal stability and enhancement of mobility. Chemical analysis indicates that oxygen vacancy related defects are suppressed in $Mg_xZn_{1-x}O$ TFTs as compared to those in ZnO TFTs. The field effect mobility is increased. The decrease in bulk trap density of $Mg_xZn_{1-x}O$ (0<x≤6%) TFT also indicates that the electron traps associated with oxygen vacancies in the ZnO channel are reduced after alloying of Mg. Both thermal and bias stress stability can be improved in $Mg_xZn_{1-x}O$ TFT. Less shifts in threshold voltage is observed in $Mg_xZn_{1-x}O$ (0<x≤6%) TFT during the temperature stressing and constant voltage stressing testing. In particularly, this innovative technology is cost-effective and eco-friendly. Both Zn and Mg are environmental friendly and bio-compatible whereas Ga and In are not. By eliminating the usage of In as one of the component in the TFT, production cost of the display system can be reduced.

In a certain embodiment, Group III elements doped ZnO TFTs and $Mg_xZn_{1-x}O$ TFTs are integrated as driver circuits for the display. The integration of driver circuits directly on the glass substrate is objective of SOG (System On Glass)

and leads to light weight displays with lower cost due to the reduction of external driver chips and driver interconnects. The motivation of higher integration is to reduce the power consumption of the display.

Figure 9:
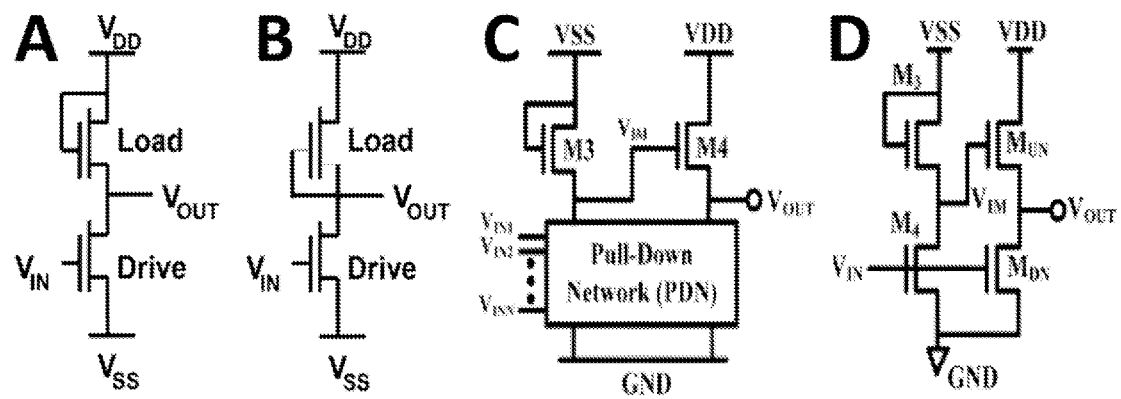
FIG. 9 illustrates n-type TFTs-based circuit schematics of: (A) an enhancement mode load/enhancement mode driver inverter; (B) a depletion mode load/enhancement mode drive inverter; (C) pseudo-CMOS logic gates; and (D) a pseudo-CMOS inverter.

This disclosure implements basic circuits for application of the system on glass including: (1) D-E inverters; (2) Pseudo-CMOS; and (3) Shift registers. The inverter is a basic circuit building block of driver circuits for displays. Active load inverters are dominant over the traditional resistive load inverters due to their compatibilities with simple fabrication process and less occupied area. Since generally ZnO is an n-type semiconductor, the NMOS based inverter configurations are to be used for ZnO TFTs. Enhancement mode load/enhancement mode driver (E/E inverter, as shown in FIG. 9A) can be easily fabricated on single substrate since the channel layers are the same for load and driver. However, the gain of an E/E inverter is limited by the W/L ratios between load and driver, meaning that the W/L of the enhancement load have to be much larger than that of driver to obtain high gain. On the other hand, depletion mode load/enhancement mode driver inverter (D/E inverter, as shown in FIG. 9B) can achieve a larger gain even with less W/L ratios between load and driver. However, the fabrication of D/E inverter for ZnO based TFTs is much more complicated than the silicon case because it is difficult to tailor the different carrier concentration of channel layers for the load and driver TFTs. However, the low field effect mobility of E-mode driver limited the gain of D-E inverter to 10V/V at a supply voltage of 10V.

In this disclosure, different doping elements are used to form the channel layers with different carrier concentrations: for the depletion-mode load (Ga doping) and enhancement-mode driver (Mg doping), respectively. Different doping elements may be used to form the channel layers with different earlier concentrations: Gallium (Ga) doping and Magnesium (Mg) doping may be used for the depletion-mode load and enhancement-mode driver, respectively. Previous studies have shown that Mg doping into ZnO can suppress background carrier concentration, therefore, increases threshold voltage to obtain enhancement mode TFT. Conversely, Group III elements such as Al and Ga, are shallow donors for ZnO to form the transparent conductive oxide (TCO) electrodes, and thus are suitable to form the depletion-mode TFT. Integration of these two TFTs can produce a high gain D/E inverter at low cost without a complicated fabrication process.

Recently, the concept of pseudo-CMOS has been proposed, which provides an alternate way to design low power display systems using ZnO based TFTs. Unlike typical CMOS technology where PMOSFETs are used as pull-up networks and NMOSFETs are used as pull-down networks, pseudo-CMOS logic gates use mono-type TFTs. Additional diode connected TFT are used as level shifter to provide pull-up force for N type TFTs as shown in FIGS. 9C and 9D. Pseudo-CMOS provides an alternate way to design low power digital circuits using ZnO based TFTs on different substrates. In addition, functional logic blocks such as NOR/NAND gate, D-Latch and D-Flip Flop can be constructed based on pseudo-CMOS for required application.

A shift register is an important functional logic block for display, RFIDs and flexible electronics. A serial-in/serial-out shift register may be implemented by connecting D-flip flops. For sequential addressing of matrix-based system such as displays and sensors, shift registers are the most commonly employed scanning circuits. The sequential pulses are generated at different stages through CLOCK input. These sequential pulses are used as scanning signals for turning on the scan line of the displays. The shift registers may have a high output pulse without any distortion and a high clock frequency for a ultrahigh resolution and high frame-rate 3D display. In this disclosure, shift registers using both of depletion mode and enhancement mode ZnO TFTs are provided. The switching speed of these shift registers can be improved by reduction of overlap capacitances of TFTs according to the resolution and frame rate of a display.

Due to the low deposition temperature of ZnO-based TFTs, display systems in accordance with the present disclosure may be implemented on different substrates, such as CMOS wafer, glass, and flexible substrates. In addition, functional logic blocks may also be built on these substrates. It should be emphasized that the present disclosure is not limited to display technology; it will find the other important applications such as transparent electronics, flexible electronics and 3D integration with CMOS.

In an embodiment of the present disclosure, ZnO RRAM is implemented by in-situ doping of ZnO. RRAM is utilized as the non-volatile (NV) memory device to store digital/analog information. The 0/1 bits correspond to HRS/LRS for such NV-RRAM device.

Figure 10A:
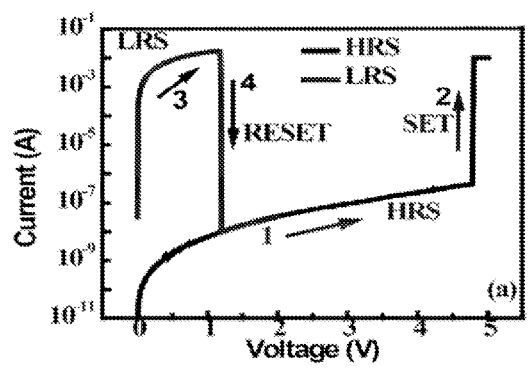
FIG. 10A shows the IV characteristics of unipolar resistive switching device of ZnO based RRAM.
Figure 10B:
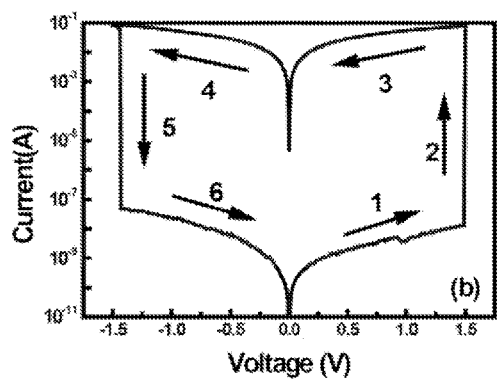
FIG. 10B depicted the IV characteristics of bipolar resistive switching device of ZnO based RRAM.

The ZnO-based TFT and RRAM are integrated to build the novel reconfigurable pixel structure. The functionality of such pixel is validated through comprehensive electrical testing including those methods described above. FIG. 10A shows a unipolar and FIG. 10B shows a bipolar ZnO based resistive switching device built on glass with a $R_{ON}/R_{OFF}$ ratio $>10^5$ for bipolar and $>10^6$ for unipolar switching device, respectively. The retention time is over $10^7$ sec. Such devices have demonstrated the ability to be operated in very loss voltage (~1.5V), particularly for displays with loss power application. With addition of ZnO TFTs as the addressing devices to form the 1T1R array, ZnO resistive random access memory (RRAM) can be realized.

Figure 11:
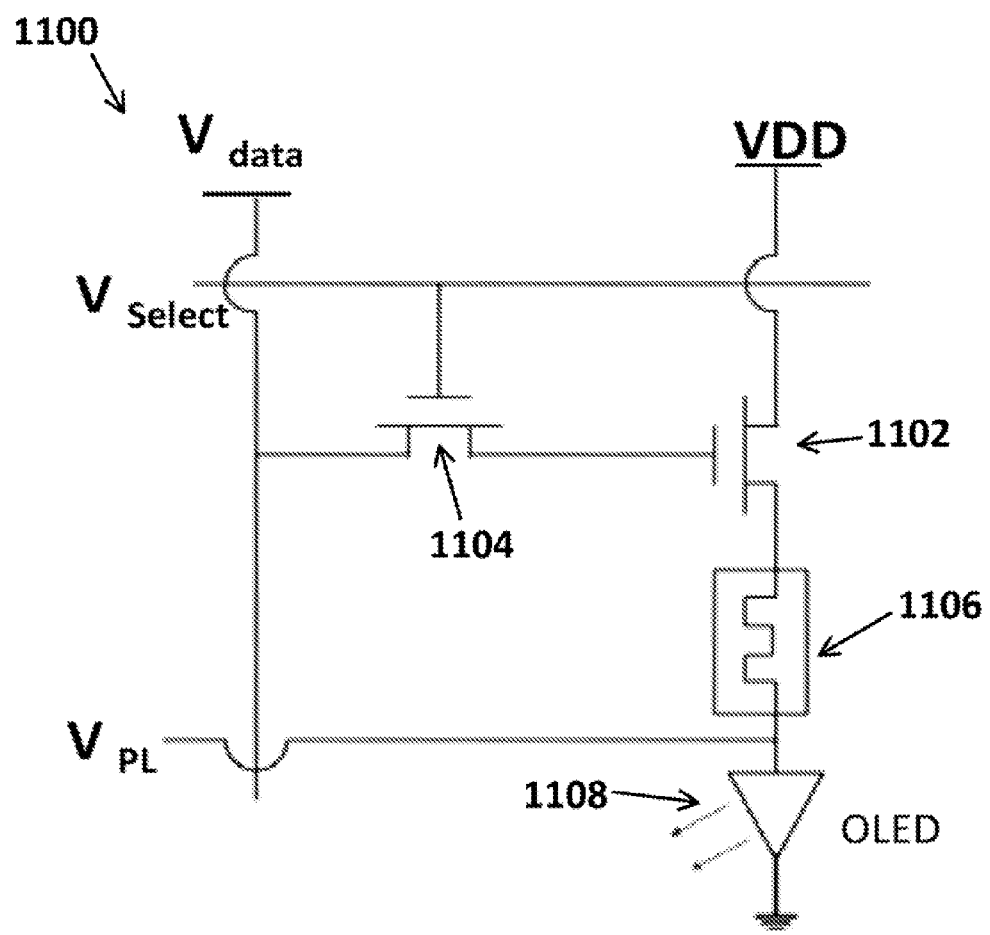
FIG. 11 shows a pixel of an AMOLED system in accordance with the present disclosure.

In an embodiment of the present disclosure, shown in FIG. 11, a pixel structure 1100 is provided to store the pixel brightness information in a NV-RRAM based on multifunctional ZnO-based devices. As shown in FIG. 11, a pixel structure 1100 utilizes ZnO TFTs. These TFT devices and control circuitry can then all be fabricated on a glass substrate for a SOG pixel structure. Pixel structure 1100 includes a driver TFT 1102 and a switching TFT 1104. Pixel structure 1100 also includes resistive non-volatile resistive random access memory (RRAM) cell 1106 and OLED 1108. RRAM cell 1106 is formed by in-situ doping of ZnO films. The switching between high resistance state (HRS) and low resistance state (LRS) in a RRAM cell 1106 is realized by applying different voltage pulses. The information can thus be stored in a RRAM cell 1106 in a non-volatile fashion. The output resistance of the RRAM cell 1106 is controlled by the available switching current. In some embodiments of the pixel design, a ZnO-based driver TFT 1102 not only drives the input current of OLED 1108 but also serves as the current limiter of RRAM cell 1106. The gate biasing voltage of the driver TFT 1102 and its output current can be adjusted by applying different voltages. The resistance of RRAM 1106, therefore, is controlled by the gate biasing voltage of the driver TFT 1102. The resistance of RRAM 1106 determines the current to drive the OLED 1108 where the brightness of the pixel can be controlled with different programming signal. The control circuitry of display system may be built separately from its glass substrate; however, packaging of those chips onto the backplane of display increases the cost and weight of the display.

In certain embodiments, the disclosed pixel structure 1100 is used to create displays for mobile devices such as smart phones and portable gaming devices. In other embodiments, the pixel structure 1100 may be used large area display technology for thin and lightweight 3D TV displays and for intelligent TV. In another embodiment, the pixel structure 1100 may be utilized in the construction of head-mounted displays, such as those used for 3D gaming and training simulators. In another embodiment, the pixel structure 1100 may be utilized for solar cell application. The proposed devices may be integrated with solar cells on the same glass substrate for efficient energy conversion which is critically important for the renewable energy.

The pixel structures are fabricated by growing ZnO films with different functions such as TFTs, RRAMs, diodes and transparent conducting oxide ("TCO") on glass substrates. Numerous methods, including, but not limited to, Fourier transform infrared spectroscopy ("FTIR"), x-ray photoelectron spectroscopy ("XPS"), field emission scanning election microscopy ("FESEM"), and atomic force microscopy ("AFM") can be used to characterize the interface and the electrical properties of the ZnO multi-functional thin films.

The presently described ZnO-based SOGs for displays have several advantages over the current amorphous silicon based display technologies. These advantages include, but are not limited to, low voltage/low power operation, high frame rates, high brightness, larger fill factors, and capability to perform 3D display. The results shown in FIGS. 4, 8, and 10 demonstrate the superior performance of ZnO-based thin film transistor (TFT) and resistive random access memory (RRAM). ZnO-based TFTs exhibit higher mobility (u~40 $cm^2/V$-s) than amorphous silicon TFTs (1.0 $cm^2/V$-s), thus indicating ZnO TFTs can be operated at higher frame rates and lower driving voltage. The low mobility of conventional amorphous silicon TFTs cannot drive display systems with frame rates higher than 120 Hz. The requirement of mobility is even higher for display with higher resolution and for 3D displays, which may require frame rates of 240 Hz.

In addition, pixels utilizing the presently described ZnO-based TFTs have a higher brightness in comparison to the current amorphous silicon based TFTs. The brightness of an OLED is determined by the driver current. Because the ZnO-based TFT driver has greater mobility than the current technology, it produces a larger output driver current, and subsequently, a greater brightness.

Additionally, low power consumption may be achieved by utilizing the non-volatile RRAM to store the information of pixel brightness. As noted above, compared to conventional TFT based non-volatile flash technology where the program voltage is high (~35V) and read/write speed is slow, the ZnO-based RRAMs of the present disclosure can be operated at much lower voltage (~1.5 V) and much faster speed (~1 nano second). The ZnO-based RRAM also has a resistance ON/OFF ratio>$10^5$ for bipolar and >$10^6$ for unipolar resistor, respectively. Thus, utilizing ZnO RRAMs in an ultra-high-density configuration achieves both the non-volatile characteristics of Flash memory and the high speed of SRAM. By incorporating ZnO based TFTs and RRAMs into a single pixel, the structure can be operated at low voltage and high frame rates. In addition, integration of all systems (e.g., memory, inverters, and the like) on glass reduces the cost to package outside circuitry on the backplane. Therefore, ultra-thin and low cost display system can be achieved using the presently described ZnO-based devices.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and script of the invention, and all such variations are intended to be included within the scope of the following claims.

We claim:

1. A system on glass (SOG) pixel circuit comprising:
   a first thin film transistor (TFT) comprising $Mg_xZn_{1-x}O$ (0<x<6%) as a channel layer, the first TFT formed directly on an electronic visual display substrate, wherein the amount of Mg is effective to provide said channel layer with a decrease in oxygen vacancy to improve thermal stability and negative bias stress stability; and
   a ZnO based non-volatile memory (NVM) resistive switching device, wherein the TFT and NVM are integrated to form a display pixel.

2. The circuit of claim 1 wherein the NVM device is formed directly on the electronic visual display substrate.

3. The circuit of claim 1 further comprising a second TFT, wherein the first TFT and the second TFT form one of an E-E inverter, a D-E inverter, a pseudo-complementary metal-oxide-semiconductor (CMOS) logic gate, and a pseudo-CMOS inverter.

4. The circuit of claim 3, wherein the second TFT is formed directly on the electronic visual display substrate.

5. The circuit of claim 3, wherein the first TFT and the second TFT form a D-E inverter and are each selectively doped with different elements.

6. The circuit of claim 5, wherein the second TFT is doped with a Group III element.

7. The circuit of claim 5, wherein the electronic visual display substrate is glass and circuits with different logical functions are integrated directly on glass and packaged as a system on glass (SOG).

8. The circuit of claim 1, wherein the electronic visual display substrate is a solid state insulating substrate.

9. The circuit of claim 1, wherein the electronic visual display substrate is a flexible substrate.

10. The circuit of claim 1, wherein the resistive switching device comprises a transition metal doped ZnO.

11. The circuit of claim 10, wherein the transition metal is iron.

12. The circuit of claim 1, wherein the circuit is implemented into the advanced displays that require high frame rates, low power and light weight.

\* \* \* \* \*